United States Patent [19]
Lippens et al.

[11] Patent Number: 6,123,787
[45] Date of Patent: Sep. 26, 2000

[54] PROCESS FOR MANUFACTURING ITO ALLOY ARTICLES

[75] Inventors: Paul Lippens, Kortemark; Ludo Froyen, Holsbeek; Louis Buekenhout, Sterrebeek, all of Belgium

[73] Assignee: Innovative Sputtering Technology, Belgium

[21] Appl. No.: 09/029,347

[22] PCT Filed: Aug. 29, 1996

[86] PCT No.: PCT/EP96/03802

§ 371 Date: Jun. 12, 1998

§ 102(e) Date: Jun. 12, 1998

[87] PCT Pub. No.: WO97/08358

PCT Pub. Date: Mar. 6, 1997

[30] Foreign Application Priority Data

Aug. 31, 1995 [EP] European Pat. Off. .............. 95202356

[51] Int. Cl.⁷ .................................................... B22F 9/04
[52] U.S. Cl. .............................. 148/513; 419/19; 419/68; 264/122
[58] Field of Search .............................. 148/513; 419/19, 419/32, 49, 68; 264/122

[56] References Cited

U.S. PATENT DOCUMENTS

| | | | |
|---|---|---|---|
| 4,482,374 | 11/1984 | Osborn et al | 148/513 |
| 5,094,787 | 3/1992 | Nakajima et al. | 501/126 |
| 5,160,675 | 11/1992 | Iwamoto et al | 264/570 |
| 5,480,531 | 1/1996 | Weigert et al. | 204/298.13 |
| 5,480,532 | 1/1996 | Schlott et al. | 204/298.13 |
| 5,522,976 | 6/1996 | Campet t al. | 419/64 |

FOREIGN PATENT DOCUMENTS

| | | |
|---|---|---|
| 0 342 537 A | 11/1989 | European Pat. Off. . |
| 40 37 733 A | 7/1991 | Germany . |
| 41 24 471 C | 6/1992 | Germany . |
| 44 07 774 C | 4/1995 | Germany . |

OTHER PUBLICATIONS

Patent Abstracts of Japan vol. 018, No. 201 (C–1188), Apr. 8, 1994 & JP 06 002124 A (Mitsubishi Mat Corp), Jan. 11, 1994, see abstract.
Patent Abstracts of Japan vol. 14, No. 322 (C–0739), Jul. 10, 1990 & JP 02 115326 A (Mitsubishi Metal Corp), Apr. 27, 1990, see abstract.
Patent Abstracts of Japan vol.017, No. 678 (C–1141), Dec. 13, 1993 & JP 05 222526 A (Asahi Glass Co Ltd), Aug. 31, 1993, see abstract.
Database WPI Section Ch, Week 9309 Derwent Publications Ltd., London, GB; Class L02, AN 93–070896 XP002000037 & JP 05 017 201 A (Sumitomo Coal Mining Co Ltd), Jan. 26, 1993 see abstract.
Patent Abstracts of Japan vol. 18, No. 185 (C–1185), Mar. 30, 1994 & JP 05 339721 A (Mitsubishi Mat Corp), Dec. 21, 1993, see abstract.
Patent Abstract of Japan vol. 95, No. 1, Feb. 28, 1995 & JP 06 293963 A (Mitsui Mining & Smelting Co Ltd), Oct. 21, 1994, see abstract.
Patent Abstracts of Japan vol. 017, No. 577 (C–1122), Oct. 20, 1993 & JP 05 170513 A (Tosoh Corp), Jul. 9, 1993, see abstract.
Patent Abstracts of Japan vol. 017, No. 554 (C–1118), Oct. 6, 1993 & JP 05 156431 A (Asahi Glass Co Ltd), Jun. 22, 1993, see abstract.

*Primary Examiner*—George Wyszomierski
*Attorney, Agent, or Firm*—Nixon & Vanderhye P.C.

[57] ABSTRACT

The invention relates to a process for manufacturing a pore free powder metallurgical alloy article starting with a minor portion of Sn powder and a major portion of $In_2O_3$ powder and comprising the steps of: substantially uniformly distributing and fixing the Sn powder on the surface of the $In_2O_3$ powder by mixing and milling the powders in the presence of a process controlling agent such as an alcohol to form alloyed powders, and compacting the so alloyed powders at high temperature to form the article. The article has a good electrical conductivity and is usable as a target for plasma sputtering ITO compositions.

9 Claims, No Drawings

PROCESS FOR MANUFACTURING ITO ALLOY ARTICLES

FIELD OF THE INVENTION

The invention relates to a process for manufacturing ITO (Indium-Tin-Oxyde) alloy articles, in particular pore free $In_2O_3$:Sn (indiumsesquioxyde:tin) articles for use as targets in plasma sputtering processes and machines (hereafter designated ISOT-articles, respectively ISOT-targets).

BACKGROUND OF THE INVENTION

It is known from DE 40 37 733 A1 to produce ITO-targets for plasma-sputtering purposes. A number of applications are cited for film substrates covered by plasma sputtering with thin ITO layers such as their use for touch panels. The targets are made by pressing and sintering a mixture of fine $In_2O_3$ powder with fine $SnO_2$ powder in an oxygen atmosphere. Although the so produced target has a high density, it has a relatively poor electrical conductivity so that it can only be used with low DC power densities in a DC-magnetron discharge.

OBJECTIVES AND BRIEF DESCRIPTION OF THE INVENTION

It is thus an objective of the invention to provide a pore free powder metallurgical alloy article with a proper proportion of In, Sn and oxygen and having a better conductivity. According to the invention the drawback of poor conductivity can be overcome if the tin (Sn) is added to the $In_2O_3$ powder not in the form of an oxyde, but in its metallic state and if the metallic Sn phase can be maintained to a large extent throughout the manufacturing process of the pore free alloy article. A "pore free" metal powder alloy article means here an article with a density of at least 95% of the theoretical density of $In_2O_3$.

It is another objective of the invention to use the article as a target in a plasma sputtering process and apparatus whereby the addition of reactive oxygen gas to the inert gas (in most cases argon) can be omitted or strongly reduced. This measure simplifies substantially the control of the sputtering process. The invention deals thus also with a plasma sputtering process, in particular a continuous process, and equipment for depositing ITO-compositions on a substrate wherein the target is sputtered off in an atmosphere comprising a stoechiometric ratio of at least 90% Ar and the balance oxygen gas. The substrate can be an elongated object such as a wire, filament, cord, yarn, strip, rod, tube or profile or a series of such objects in a parallel arrangement. The substrate can also be a planar object such as a foil, film, web, woven, braided, knitted or non woven fabric, plate or sheet. Depending on the shape of the substrate to be covered with the ITO composition the target can have a planar or tubular shape.

According to the invention these objectives are achieved by a process for manufacturing a pore free powder metallurgical alloy article starting with a minor portion of Sn powder and a major portion of $In_2O_3$ powder and comprising the steps of substantially uniformly distributing and fixing the Sn powder on the surface of the $In_2O_3$ powder by mixing and milling the different powders in the presence of a process controlling agent to form alloyed powders and compacting at high temperature the so alloyed powders to form the article.

The mixing and milling operation produces thereby a plastical kneading effect on the powders. For reasons of convenience, the pore free powder alloy and the derived article obtained by the process of the invention will be designated further on an ISOT-powder or ISOT-article.

The starting $In_2O_3$ and Sn powders can have widely varying powder particle sizes. $In_2O_3$ powder is normally produced by roasting $In(OH)_3$ and crushing the compound to the desired particle size, thereby forming particles with a rather irregular shape and a quite flaky aspect. Preferably, the average volume of an individual $In_2O_3$ powder particle is larger than that of an individual Sn powder particle. The overall Sn content in the article is between 3% and 25 wt %, preferably between 8% and 15%, and the density after the final compacting is preferably at least 97% of the theoretical density of the composition. Anyway the mass density or specific weight of the metal powder alloy article is preferably at least 6.8 g/cm$^3$. As a consequence the article has an electrical resistivity of preferably less than 1 mOhmcm.

The process for making the article starts with mixing and milling the different powders. This will preferably be done at room temperature. Several methods for mixing and milling are possible and will be described further. One preferred method comprises a mixing and milling operation in an attritor, a planetary mill or other high energy mill in the presence of ethanol as a process control agent. However the different powders can be mixed in a conventional manner before such ultimate mixing and milling step.

Since $In_2O_3$ powder is very hydrophilous, it easily converts to $In(OH)_3$ or intermediate compositions between the two. During the later compacting and consolidation step at high temperature these compositions will again release both $H_2O$ and $H_2$ gases. The forming of the latter gas may thereby be catalysed by the Sn phase in the mixture. This phenomenon hinders a proper compaction since the gas may remain encapsulated in the compacted powders and thereby prevent the forming of a sufficiently dense alloy article. Either the pick up of water or hydrogen by the powders should thus be avoided or the hydrogen or water bonded to or released by the contaminated powders should be removed before compacting and consolidation. A degassing operation on the powders, preferably on the alloyed powders, is thus generally necessary to remove all $H_2O$, hydroxyde and $H_2$ before compacting and consolidation. When this degas-sing is carried out on the initial powders, then the following steps are carried out in an environment substantially free from $H_2$, $H_2O$ and $O_2$. Degassing is performed in an inert gas; Ar and $N_2$ are suitable. Principally degassing is carried out at a slightly higher temperature than that of the subsequent compaction at high temperature. After degassing the alloyed powders are cooled down under a protective atmosphere, eg. again $N_2$ or Ar and are stored in containers under inert gas.

According to a further aspect of the invention the subsequent compacting step comprises preferably a CIP-process (Cold Isostatic Pressing) of the degassed metal alloy powder combined with a HIP-process (Hot Isostatic Pressing). The metal alloy article may have any desired shape. In particular for the purpose of their use as a target in a sputtering apparatus, the article will generally have the shape of a plate (planar target) or tube (eg. for rotatable targets). During the shaping process by a combined CIP-HIP-process the metal alloy powder will generally be fixed on a supporting structure of another material. The plate or tube is thus covered then at one surface with the other material. In the application of the powder metallurgical alloy article as a target for plasma sputtering ITO compositions the other material is then of course situated at the side opposite to the sputtering side of the target. In a preferred embodiment the supporting material is in the form of a stainless steel member, coated with Ni and further with a Ti layer which is in contact with the ITO composition.

When an elongated object has to be covered, the apparatus for carrying out the process will comprise a target in the form of a stationary tubular structure fixed to the inner side of a supporting tube of the other material. This tubular structure is mounted in the sputtering apparatus which further comprises the conventional magnet array, the supply means for Ar gas, for cooling water, for electrical power supply etc. When a sheet like object is to be covered, the apparatus may comprise at least one target in the form of a rotatable tubular structure fixed to the outer side of a supporting tube of the other material. This other material is generally a metal and such target arrangements are generally known from WO 95/08438.

DETAILED DESCRIPTION OF CERTAIN EMBODIMENTS

EXAMPLES

The invention will now be further described with reference to certain examplary embodiments, usable as rotatable ITO-targets for plasma sputtering. Additional aspects and advantages will thereby be clarified.

The first step in the manufacture of the pore free powder metallurgical alloy article relates to the substantially uniform distribution of a minor portion of the Sn powder in the $In_2O_3$ powder batch. In order to end up with a target material having the required chemical composition for depositing eg. transparent electronic conductors (ITO coatings), starting powders have to be chosen with a high purity (at least 99.9% and preferably 99.99%). The mixing can be done at room temperature and in broadly varying conditions and equipment. As an example mixing can be carried out in a threedimensional turbula-mill using steatite balls (diameter 6 mm, 100 g of balls per 100 g of powder) in order to enhance the efficiency of the mixing. The mixing is done at a relatively low speed of the turbula (eg. about 70 rpm) and during eg. 2 hours. The mixing can also be done in a twodimensional ball mill.

To produce the alloyed powders the Sn powder is preferably fixed on the surface of the $In_2O_3$ powder eg. by a kind of mechanical alloying operation. Such operations are known mainly for combining a major proportion of soft powders with a minor proportion of hard powders. The harder particles are then mechanically pressed in the soft ones. The situation according to the present invention is however contrary. To achieve a substantial uniform distribution a minor proportion of the soft Sn powder will preferably be substantially evenly distributed on the surface of the harder $In_2O_3$ particles. According to the invention this will preferably be done at room temperature in an attritor or planetary mill with chromium steel balls, having a diameter between 4 mm and 7 mm and in the presence of an alcohol, eg. ethanol, as a process controlling agent. When using an attritor, the alloying can be done at moderate speed (eg. about 150 rpm) during about one hour in air or in an inert atmosphere. The uniformity of the distribution will generally be improved when the mechanical alloying in the attritor is carried out on a premix of the powders, eg. as produced in the turbula-mill mixing process described above. However this premixing step can be deleted in case the mechanical alloying step is slightly adapted.

For the reasons stated above, a thermal degassing of the so alloyed powder is highly preferred. Only when the initial powders would have been degassed and the subsequent mixing and mechanical alloying plus feeding to the moulding press would have been carried out in a protective atmosphere ($N_2$ or Ar) or in vacuum a thermal degassing step could be avoided. Such processing in vacuum or in inert gases is however not considered very practical. For the purpose of the thermal degassing operation the alloyed powder can be spread out on a carrier and heated in a furnace for some hours under a protective pure gas atmosphere (preferably 4N to 5N pure $N_2$ or Ar). The so degassed powder is then cooled down to room temperature under the protective atmosphere and stored in vessels again in the same inert gas, preferably under overpressure.

Alternatively the $In_2O_3$ powders with a coarser granulometry (minimum particle size of 20 $\mu$m) could first be covered with a thin Sn-layer. Degassing would thereby become less critical since the protective Sn layer would suppress the conversion to $In(OH)_3$. A mechanical alloying step could then possibly be deleted.

The final compacting step for the purpose of transforming the degassed powder to the pore free alloyed ISOT-article with the desired shape and conductivity will now be described with reference to the production of a tubular target for plasma sputtering ITO layers. Firstly a supporting tube is concentrically fixed within an outer can and welded thereto. The supporting tube can be either commercial titanium (as supplied by TICO TITANIUM, Inc., Farmington Hills, Mich. 48335, U.S.A.) or a precoated commercial stainless steel (AISI304). The precoating consists of an electrolytic Ni-coating of some 50–150 $\mu$m, followed by a flame or plasma sprayed Ti-coating (some 80–200 $\mu$m thick). The Ni-coating may also be deposited by flame or plasma spraying (thickness 50–200 $\mu$m). The outer can tube should be commercial carbon steel (e.g. St35 or St37 or equivalent), which should be coated with $Al_2O_3$ on its inner wall by a spraying technique or by electrolytic aluminizing followed by an anodization step. As an alternative, an anodized Al-foil may also be fixed to the inner surface of the steel tube. Such foil is produced in the lighting industry with thicknesses of around 0.4 mm. The anodisation process for such foil should however be adapted : inclusion of organic compounds in the $Al_2O_3$-layer should be avoided which is no problem since a shiny aspect is not at all required. The end sections of the supporting tube and the outer can tube are welded together (gas tight) so as to provide a tubular inner space. The other end section is sealed off by a suitable end cap to provide a tubular inner space.

This space is evacuated and then filled up in a conventional manner with the alloyed ISOT-powder for the purpose of the subsequent isostatic pressing steps at a pressure of preferably at least 1000 bar. The can is preferably heated before filling it up with the alloyed powder in view of further improving the degassing effect. A combined CIP-HIP process is then started which can have the following characteristics. For the CIP-process step the inner and outer surface of the tubular structure is put under isostatic pressure at room temperature with a pressure build up to between 1000 and 4000 bar and at least a two hours dwell time at this pressure. For the subsequent HIP-process step the pressure is then changed to about 2000 bar whereas the temperature is increased to 500° C. and the tubular structure remains in this condition for about 4 hours. Pressure and temperature are thereafter released to atmospheric conditions during a controlled cooling period of several hours.

Thereafter, the outer can tube is removed by careful machining to retain the tubular ISOT-target fixed on the outside of its tubular support. In a modified process, machining is only done up to a remaining outer can tube thickness of 0.5–1 mm. The remaining steel (with Al/Al$_2$O$_3$ or Al$_2$O$_3$) is then removed chemically or electrochemically. Alternatively, the remaining part of the outer can tube may also be removed by sputter etching on a DC-magnetron with a suitable magnet array. The overall wall thickness of the laminated stainless steel/Ni-Ti/ISOT-wall is 6 to 25 mm. The ISOT-target layer thickness is about 3 to 7 mm.

With an initial Sn powder content of 17 wt % in the initial powder mixture, the above process results in a ISOT-target density of minimum 95%. a specific weight of the ISOT material of at least 6.8 g/cm$^3$ and an electrical resistivity of about 1 mOhm.cm. With an initial Sn powder content of 10 wt % in the initial powder mixture, the above process may result in a ISOT target density of about 98% and a specific weight of about 7 g/cm$^3$. The CIP/HIP process did not result in an excessive diffusion of the Ti into the ISOT material (or of Sn into the Ti/Ni-interlayer) at their interface. The inter-diffused intermediate layer had a thickness of only a few $\mu$m. During the HIP-process the Ni-layer bonds chemically to the AISI 304 support. A strong alloy bond is also created during the HIP-process between the Ni- and Ti-layer and between Ti and the Sn of the ISOT-composition. In this way a gradual transition is generated for the thermal expansion coefficient between stainless steel (19 $\mu$m/mK)-Ni (13,3 $\mu$m/mK)-Ti 99% (8,9 $\mu$m/mK)-ISOT (7.2 $\mu$m/mK).

In an alternative CIP/HIP process. the pressure can be built up to eg. 2000 bar at room temperature and after a residence time of 2 hours the temperature is increased to 500° C. and the isostatic HIP a pressure to 4000 bar. In a further alternative embodiment the degassed powder is isostatically pressed (CIP) in a rubber mould on the Ti- or precoated AISI 304—supporting tube (as described above) at about 3700 bar during several hours whereby it reaches density of about 55%. After removing the rubber mould, a metallic outer can is applied and the compacted alloy is introduced in a HIP furnace where it is heated to 500° C. during 4 hours. The HIP process can also be carried out without using an outer can since the alloyed powder is already considerably consolidated during the CIP step.

The tubular target with its precoated AISI 304 or Ti-support can be arranged as a rotatable cathode in a conventional DC plasma sputtering apparatus for continuously depositing ITO coating layers on eg. a transparant polyester film with a thickness of 23 to 200 $\mu$m. Due to the excellent conductivity of the target material the DC-magnetron sputtering process can be carried out with a high power density of eg. 10 to 15 W/cm$^2$ in the race track. This is a great advantage since it is known that reactive sputtering of In/Sn targets in Ar with oxygen is relatively slow (due to an upper power limit of a power density in the race track of some 7.0 W/cm$^2$ to avoid melting of the In/Sn-target) and not easy to keep under control. The ITO layer thickness on the film substrate may range from 0.02 to 0.20 $\mu$m. Before or after depositing the ITO layer, other materials can of course be applied to the substrate.

What is claimed is:

1. A process for manufacturing a pore free powder metallurgical alloy article starting with a minor portion of Sn powder and a major portion of In$_2$O$_3$ powder, wherein both the Sn and In$_2$O$_3$ powders have a purity of at least 99.9%, the process comprising the steps of:

(i) forming an alloyed powder of the Sn and In$_2$O$_3$ powders such that the Sn powder is substantially uniformly distributed and fixed on the surface of the In$_2$O$_3$ powder by mixing and milling the Sn and In$_2$O$_3$ powders in the presence of an alcohol as a process controlling agent; and (ii) compacting at high temperature the alloyed powder to form the article; wherein (iii) the volume of the individual In$_2$O$_3$ powder is on average larger than that of the individual Sn powder.

2. A process according to claim 1 wherein the mixing and milling is carried out at room temperature.

3. A process according to claim 1 wherein the Sn and In$_2$O$_3$ powders are mixed and milled in an attritor or a planetary mill.

4. A process according to claim 1 or 3, wherein the Sn and In$_2$O$_3$ powders are premixed before the mixing and milling step (ii).

5. A process according to claim 1, further comprising a degassing operation before the compacting step (ii).

6. A process according to claim 5, wherein the degassing operation is applied on the initial Sn and In$_2$O$_3$ powders, and wherein the other steps are carried out in an environment substantially free from H$_2$, H$_2$O and O$_2$.

7. A process according to claim 5 or 6 wherein a degassing is applied on the alloyed powders.

8. A process according to claim 1, wherein the compacting step (ii) comprises a cold isostatic press-process combined with a hot isostatic press-process.

9. A process according to claim 8, wherein the compacting step (ii) is practiced at a compacting pressure of at least 1000 bar.

* * * * *